(12) United States Patent
Johnson (10) Patent No.: US 10,834,342 B2
(45) Date of Patent: Nov. 10, 2020

(54) IMAGE SENSORS WITH REDUCED NOISE

(71) Applicant: SEMICONDUCTOR COMPONENTS INDUSTRIES, LLC, Phoenix, AZ (US)

(72) Inventor: Richard Scott Johnson, Boise, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/383,230

(22) Filed: Apr. 12, 2019

(65) Prior Publication Data

US 2020/0252559 A1    Aug. 6, 2020

Related U.S. Application Data

(60) Provisional application No. 62/799,988, filed on Feb. 1, 2019.

(51) Int. Cl.
| | |
|---|---|
| *H04N 5/341* | (2011.01) |
| *H04N 5/355* | (2011.01) |
| *H04N 5/225* | (2006.01) |
| *H01L 27/146* | (2006.01) |
| *H04N 5/357* | (2011.01) |

(52) U.S. Cl.
CPC ....... *H04N 5/341* (2013.01); *H01L 27/14605* (2013.01); *H04N 5/2254* (2013.01); *H04N 5/357* (2013.01); *H04N 5/3559* (2013.01)

(58) Field of Classification Search
CPC ...... H04N 5/341; H04N 5/2254; H04N 5/357; H04N 5/3559; H01L 27/14605
See application file for complete search history.

(56) References Cited

U.S. PATENT DOCUMENTS

| | | | |
|---|---|---|---|
| 2012/0312967 A1 | 12/2012 | De Wit et al. | |
| 2013/0214371 A1* | 8/2013 | Asatsuma | H01L 27/14636 257/432 |
| 2017/0092683 A1* | 3/2017 | Geurts | H01L 27/14643 |
| 2018/0191969 A1* | 7/2018 | Innocent | H04N 5/3559 |
| 2018/0220092 A1 | 8/2018 | Takaya et al. | |
| 2018/0295303 A1* | 10/2018 | Murao | H04N 5/379 |

* cited by examiner

*Primary Examiner* — Gevell V Selby
(74) *Attorney, Agent, or Firm* — Treyz Law Group, P.C.; Tianyi He (57) ABSTRACT

An image senor may include an array of pixels controlled by row control circuitry. Each pixel may include a photodiode for generating image signals and a charge storage structure coupled to a floating diffusion region and configured to generate and store parasitic light noise level signals. The image signals and the parasitic light noise level signals may be read out in the same readout cycle using shared or separate readout circuitry. Processing circuitry may selectively process the image signals based on the parasitic light noise level signals to generate image signals with reduced noise.

18 Claims, 10 Drawing Sheets

IMAGE SENSORS WITH REDUCED NOISE

This application claims the benefit of provisional patent application No. 62/799,988, filed Feb. 1, 2019, which is hereby incorporated by reference herein in its entirety.

BACKGROUND

This relates generally to imaging systems, and more particularly, to imaging systems with global shutter functionalities.

Modern electronic devices such a cellular telephones, cameras, and computers often use digital image sensors. Imagers (i.e., image sensors) often include a two-dimensional array of image sensing pixels. Each pixel typically includes a photosensor such as a photodiode that receives incident photons (light) and converts the photons into electrical signals.

Conventional image sensors are fabricated on a semiconductor substrate using complementary metal-oxide-semiconductor (CMOS) technology or charge-coupled device (CCD) technology. In CMOS image sensors, a rolling shutter or a global shutter may be used. In CMOS image sensors with a global shutter, a storage node region is typically incorporated into each pixel to store charge from the photodiode for read out. Furthermore, global shutter pixels without an independent charge storage region may use the floating diffusion for charge storage. Storage regions may collect undesired stray light that corrupts the charge from the photodiode. This may increase noise in the pixels (e.g., increase sensitivity to parasitic light at the floating diffusion region and lower global shutter efficiency), thereby decreasing the image quality.

It would therefore be desirable to be able to provide improved image sensors with global shutter functionality.

DETAILED DESCRIPTION

Electronic devices such as digital cameras, computers, cellular telephones, and other electronic devices include image sensors that gather incoming image light to capture an image. The image sensors may include arrays of imaging pixels. The pixels in the image sensors may include photosensitive elements such as photodiodes that convert the incoming image light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the imaging pixels and readout circuitry for reading out image signals corresponding to the electric charge generated by the photosensitive elements.

Figure 1:
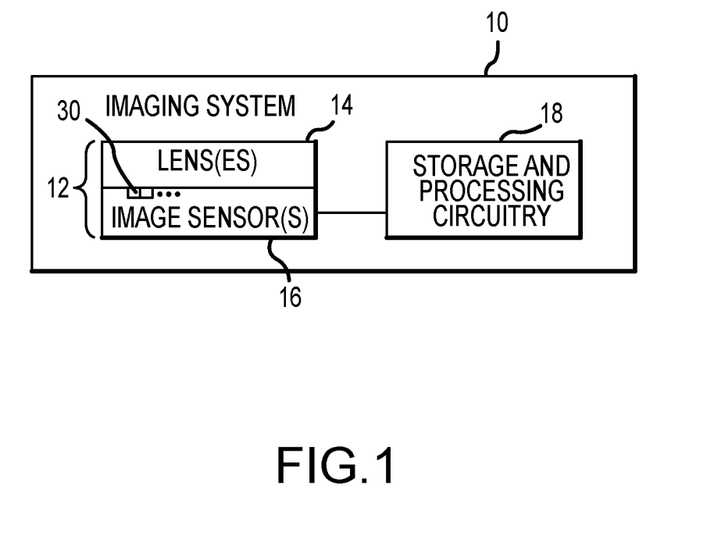
FIG. 1 is a diagram of an illustrative imaging system that may include an image sensor having image pixels operable in a global shutter mode in accordance with some embodiments.

FIG. 1 is a diagram of an illustrative imaging system that uses an image sensor with a global shutter function. Imaging system 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. Image sensor 16 may be an image sensor integrated circuit die with an array of image pixels 30. Image pixels 30 may each include a shutter element for controlling when charge is acquired on the image pixel.

During image capture operations, lens 14 may focus light from a scene onto an image pixel array in image sensor 16. Image sensor 16 may provide corresponding digital image data to control circuitry such as storage and processing circuitry 18.

Circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be further processed and/or stored using processing circuitry 18. Processed image data may, if desired, be provided to external equipment (e.g., a computer or other device) using wired and/or wireless communications paths coupled to processing circuitry 18. Processing circuitry 18 may be used in controlling the operation of image sensors 16.

Figure 2:
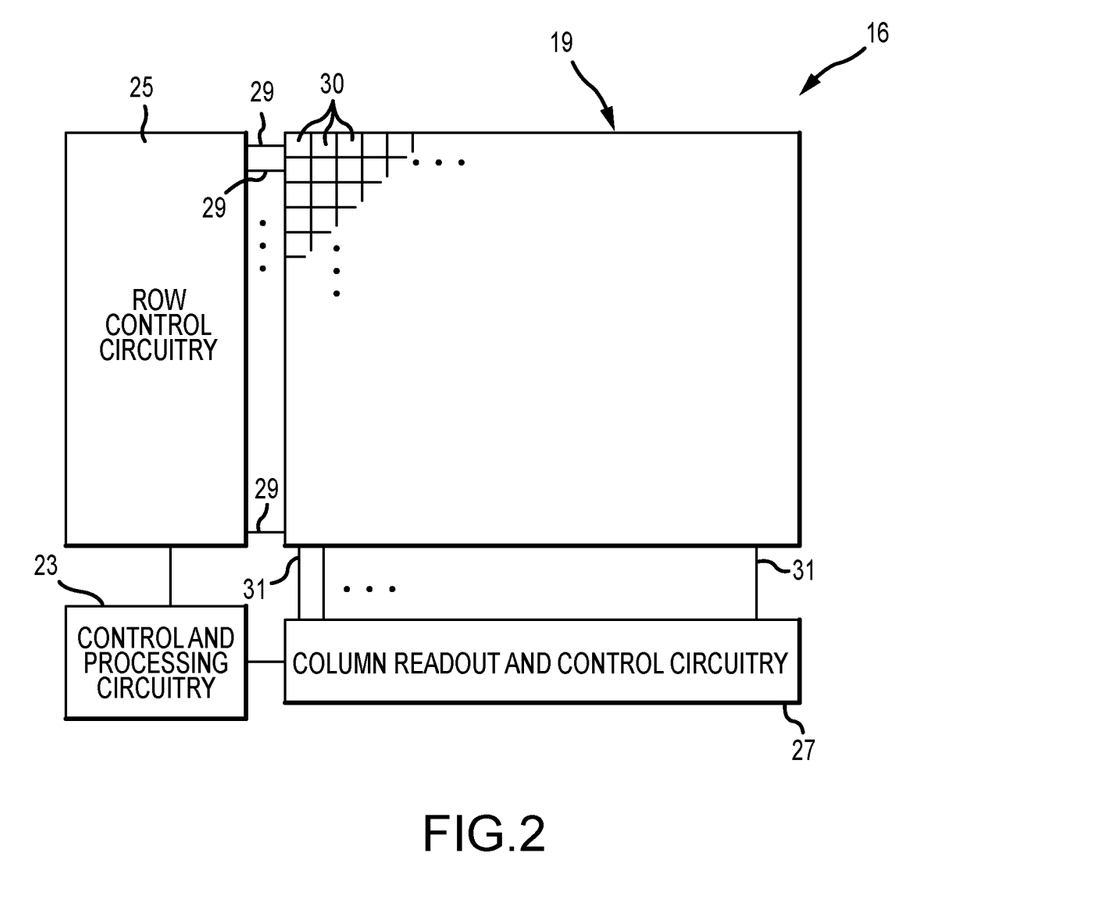
FIG. 2 is a diagram of an illustrative pixel array and associated readout circuitry for reading out image signals from the pixel array in accordance with some embodiments.

As shown in FIG. 2, image sensor 16 may include a pixel array 19 containing image sensor pixels 30 arranged in rows and columns (sometimes referred to herein as image pixels or pixels) and control and processing circuitry 23. Array 19 may contain, for example, hundreds or thousands of rows and columns of image sensor pixels 30. Control circuitry 23 may be coupled to row control circuitry 25 and image readout circuitry 27 (sometimes referred to as column control circuitry, readout circuitry, processing circuitry, or column decoder circuitry). Row control circuitry 25 may receive row addresses from control circuitry 23 and supply corresponding row control signals such as reset, row-select, charge transfer, dual conversion gain, and readout control signals to pixels 30 over row control paths 29. One or more conductive lines such as column lines 31 may be coupled to each column of pixels 30 in array 19. Column lines 31 may be used for reading out image signals from pixels 30 and for supplying bias signals (e.g., bias currents or bias voltages) to pixels 30. If desired, during pixel readout operations, a pixel row in array 19 may be selected using row control circuitry 25 and image signals generated by image pixels 30 in that pixel row can be read out along column lines 31.

Image readout circuitry 27 may receive image signals (e.g., analog pixel values generated by pixels 30) over column lines 31. Image readout circuitry 27 may include sample-and-hold circuitry for sampling and temporarily storing image signals read out from array 19, amplifier circuitry or a multiplier circuit, analog to digital conversion (ADC) circuitry, bias circuitry, column memory, latch circuitry for selectively enabling or disabling the column circuitry, or other circuitry that is coupled to one or more columns of pixels in array 19 for operating pixels 30 and for reading out image signals from pixels 30. ADC circuitry in readout circuitry 27 may convert analog pixel values received from array 19 into corresponding digital pixel values (sometimes referred to as digital image data or digital pixel data). Image readout circuitry 27 may supply digital pixel data to control and processing circuitry 23 and/or processor 18 (FIG. 1) for pixels in one or more pixel columns.

If desired, image pixels 30 may include more than one photosensitive region for generating charge in response to image light. Photosensitive regions within image pixels 30 may be arranged in rows and columns on array 19. Pixel array 19 may be provided with a filter array having multiple (color) filter elements (each corresponding to a respective pixel) which allows a single image sensor to sample light of different colors or sets of wavelengths. As an example, image sensor pixels such as the image pixels in array 19 may be provided with a color filter array having red, green, and blue filter elements, which allows a single image sensor to sample red, green, and blue (RGB) light using corresponding red, green, and blue image sensor pixels arranged in a Bayer mosaic pattern.

The Bayer mosaic pattern consists of a repeating unit cell of two-by-two image pixels, with two green image pixels (under filter elements that pass green light) diagonally opposite one another and adjacent to a red image pixel (under a filter element that passes red light) diagonally opposite to a blue image pixel (under a filter element that passes blue light). In another suitable example, the green pixels in a Bayer pattern may be replaced by broadband image pixels having broadband color filter elements (e.g., clear color filter elements, yellow color filter elements, etc.). In yet another example, one of the green pixels in a Bayer pattern may be replaced by infrared (IR) image pixels formed under IR color filter elements and/or the remaining red, green, and blue image pixels may also be sensitive to IR light (e.g., may be formed under filter elements that pass IR light in addition to light of their respective colors). These examples are merely illustrative and, in general, filter elements of any desired color and/or wavelength and in any desired pattern may be formed over any desired number of image pixels 30.

Additionally, separate microlenses may be formed over each image pixel 30 (e.g., with light or color filter elements interposed between the microlenses and image pixels 30). The microlenses may form an array of microlenses that overlap the array of light filter elements and the array of image sensor pixels 30. Each microlens may focus light from an imaging system lens onto a corresponding image pixel 30, or multiple image pixels 30 if desired.

Image sensor 16 may include one or more arrays 19 of image pixels 30. Image pixels 30 may be formed in a semiconductor substrate using complementary metal-oxide-semiconductor (CMOS) technology or charge-coupled device (CCD) technology or any other suitable photosensitive devices technology. Image pixels 30 may be frontside illumination (FSI) image pixels or backside illumination (BSI) image pixels. If desired, image sensor 16 may include an integrated circuit package or other structure in which multiple integrated circuit substrate layers or chips are vertically stacked with respect to each other. In this scenario, one or more of circuitry 23, 25, and 27 may be vertically stacked above or below array 19 within image sensor 16. If desired, lines 31 and 29 may be formed from vertical conductive via structures (e.g., through-silicon vias or TSVs) and/or horizontal interconnect lines in this scenario.

Figure 3:
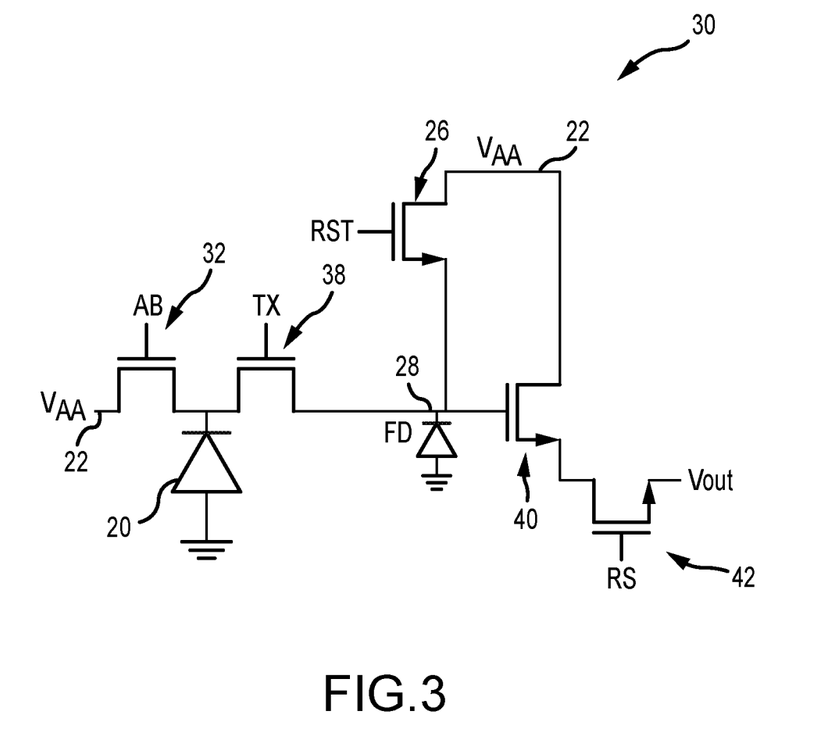
FIG. 3 is a diagram of an illustrative image pixel operable in a global shutter mode in accordance with embodiments.

FIG. 3 is a circuit diagram of an illustrative image pixel 30. As shown in FIG. 3, pixel 30 includes a photosensitive element such as photodiode 20. A positive power supply voltage VAA may be supplied at positive power supply terminal 22. Incoming light may be collected by photodiode 20. In certain embodiments, a color filter structure may be included and incoming light may pass through the color filter structure before being collected in photodiode 20. Photodiode 20 may generate charge (e.g., electrons) in response to receiving impinging photons. The amount of charge that is collected by photodiode 20 depends on the intensity of the impinging light and the exposure duration (or integration time).

Before an image is acquired, reset transistor 26 may be turned on to reset charge storage structure 28 (sometimes referred to as a floating diffusion region or FD) to voltage VAA. The reset voltage level stored at floating diffusion region 28 may be read out using charge readout circuity. The charge readout circuitry may include source follower transistor 40 and row select transistor 42. The reset level signal may be stored and subsequently used in a correlated double sampling readout scheme with an image level signal.

Pixel 30 may include an AB (anti-blooming) reset transistor such as AB transistor 32. When reset transistor 32 is turned on, photodiode 20 may be reset to power supply voltage VAA (e.g., by connecting VAA to photodiode 20 through reset transistor 32). When AB transistor 32 is turned off, photodiode 20 may be allowed to accumulate photo-generated charge.

Pixel 30 may include a transfer transistor 38. Transfer transistor 38 may be turned on to transfer charge from photodiode 20 to floating diffusion region 28. Floating diffusion region 28 may be a doped semiconductor region (e.g., a region in a silicon substrate that is doped by ion implantation, impurity diffusion, or other doping process).

As an example, before or after the reset level signal is generated and read out, AB transistor 32 may shutter (e.g., be turned on and then off) to beginning charge accumulation at photodiode 20. After a suitable integration period, transfer transistor 38 may be turned on to transfer the accumulated charge to floating diffusion region 28. The accumulated charge may then be read out using charge readout circuitry (e.g., transistors 40 and 42).

Row select transistor 42 may have a gate that is controlled by a row select signal. When the row select signal is asserted, transistor 42 is turned on and a corresponding signal Vout (e.g. an output signal having a magnitude that is proportional to the amount of charge at floating diffusion node 28), is passed onto the pixel output path. This occurs both for the reset level signal readout and for the image level signal readout.

In a typical image pixel array configuration, there are numerous rows and columns of pixels 30. A column readout path may be associated with each column of pixels 30 (e.g., each image pixel 30 in a column may be coupled to the pixel output path through an associated row-select transistor 42). The row select signal may be asserted to read out signal Vout from a selected image pixel onto the column readout path. Image data Vout may be fed to processing circuitry 18 for further processing. The circuitry of FIG. 3 is merely illustrative.

However, using pixel 30 in the manner above fails to account for and protect against undesired stray light from corrupting image signals stored at floating diffusion region 28 in pixel 30. The undesired stray light causes noise to be introduced at floating diffusion region 28 in pixel 30. In order to manage and account for the introduced noise, an image pixel such as image pixel 30' in FIG. 4 is introduced.

Figure 4:
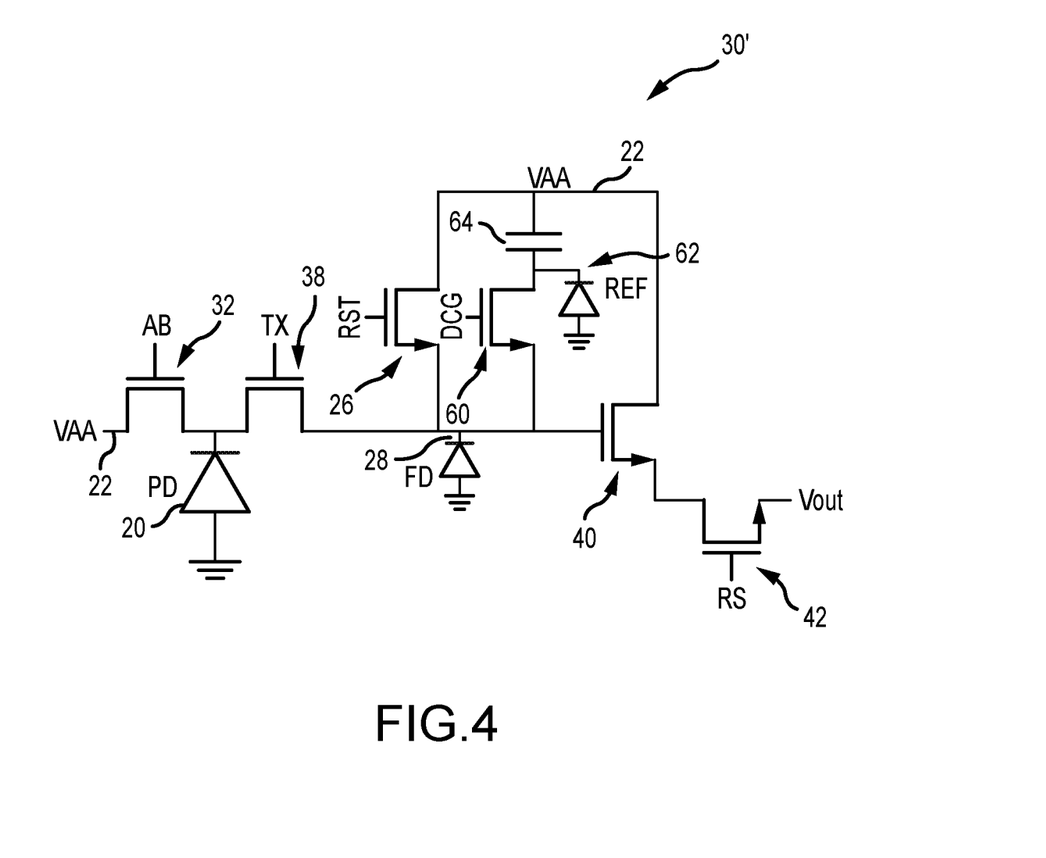
FIG. 4 is a diagram of an illustrative image pixel having a charge storage region that stores a parasitic light reference voltage, also referred to as noise, in accordance with some embodiments.

As shown in FIG. 4, pixel 30' in FIG. 4 may have some components that are similar to those in pixel 30 in FIG. 3 and the description of these components are omitted to prevent unnecessarily obscuring the present embodiments. Elements in FIG. 4 with references similar to those in elements in FIG. 3 can be assumed to serve similar functions, to operate in a similar manner, etc., unless otherwise described below.

Pixel 30' may additionally include dual conversion gain transistor 60, charge storage structure 62, and capacitor 64. Transistor 60 may couple charge storage structure 62 to floating diffusion region 28. Capacitor 64 may be interposed between charge storage structure 62 and positive voltage supply 22 (e.g., a voltage supply rail). As such, capacitor 64 may help hold charge at the storage node of charge storage structure 62 (e.g., decouple voltage VAA from storage structure 62). As examples, charge storage structure 62 may be a capacitor, a storage diode, a storage node, a storage gate, a storage charge structure having a storage region formed in a similar manner as floating diffusion region 28, etc. If desired, charge storage structure 62 may have storage capacity that is larger than that of floating diffusion region 28 (e.g., that is two times larger, three times larger, five times larger, ten times larger, etc.).

In some embodiments, charge storage structure 62 may extend the storage capacity of floating diffusion region 28 in storing image charge (e.g., by activating transistor 60, when charge stored at floating diffusion region 28 is above a potential barrier of transistor 60 and overflows to storage structure 62, etc.). As an example, charge storage structure 62 may extend the storage capacity of floating diffusion region 28 in a low conversion gain (LCG) mode, and floating diffusion region 28, but not charge storage structure 62, may be used to store image charge in a high conversion gate (HCG) mode.

Instead of or in addition to these functionalities (e.g., instead of an LCG mode and/or in addition to an HCG mode), charge storage structure 62 may be configured to capture and store a parasitic or stray light reference voltage. The parasitic light reference voltage level may represent and/or correspond to an amount of undesirable parasitic light that reaches floating diffusion region 28. In order to more accurately represent and/or correspond to the undesirable parasitic light that reaches floating diffusion region 28, charge storage structure 62 may be placed in a similar environment as that of diffusion region 28 and/or provided in a similar manner as diffusion region 28 (e.g., adjacent to diffusion region 28 in a pixel layout, in a same die as diffusion region 28, in a similar optical environment, having a similar depth, having a similar size, having a similar shape, formed from similar materials, etc.).

By monitoring and storing a reference voltage level (e.g., using storage structure 62) that corresponds to parasitic light undesirably captured by floating diffusion region 28, pixel 30' can estimate and account for the parasitic noise in an image signal. As an example, the reference voltage stored at storage structure 62 may be transferred to floating diffusion region 28 for subsequent readout using the charge readout circuitry in pixel 30' similar to what is done to generate the reset level signal and the image level signal. The read-out noise reference signal may then be subtracted from the image level signal to account for any noise contamination in the image level signal. This may similarly be done for the reset level signal, if desired.

Additionally, the read-out noise reference signal may be scaled before being subtracted as desired to represent the actual amount of parasitic noise in the image level signal. As an example, in some embodiments, storage structure 62, which stores the noise reference voltage level may be two times higher in parasitic light sensitivity than the floating diffusion region 28. As such, the read-out noise reference signal may be halved (or scaled in any other way to account for the difference in sensitivity between floating diffusion region 28 and storage structure 62) before being subtracted from the image level signal. As another example, floating diffusion region 28 and storage structure 62 may be reset to a pixel reference voltage at different times, and the image voltage level may be exposed to a different amount of noise than the noise reference voltage level across two differing lengths of time. As such, the read-out noise reference signal may be scaled according to these timing differences. These scaling and subtraction operations may be performed using digital processing (or analog processing if desired) by column readout circuitry and/or digital signal processing circuitry as appropriate.

Figure 5A:
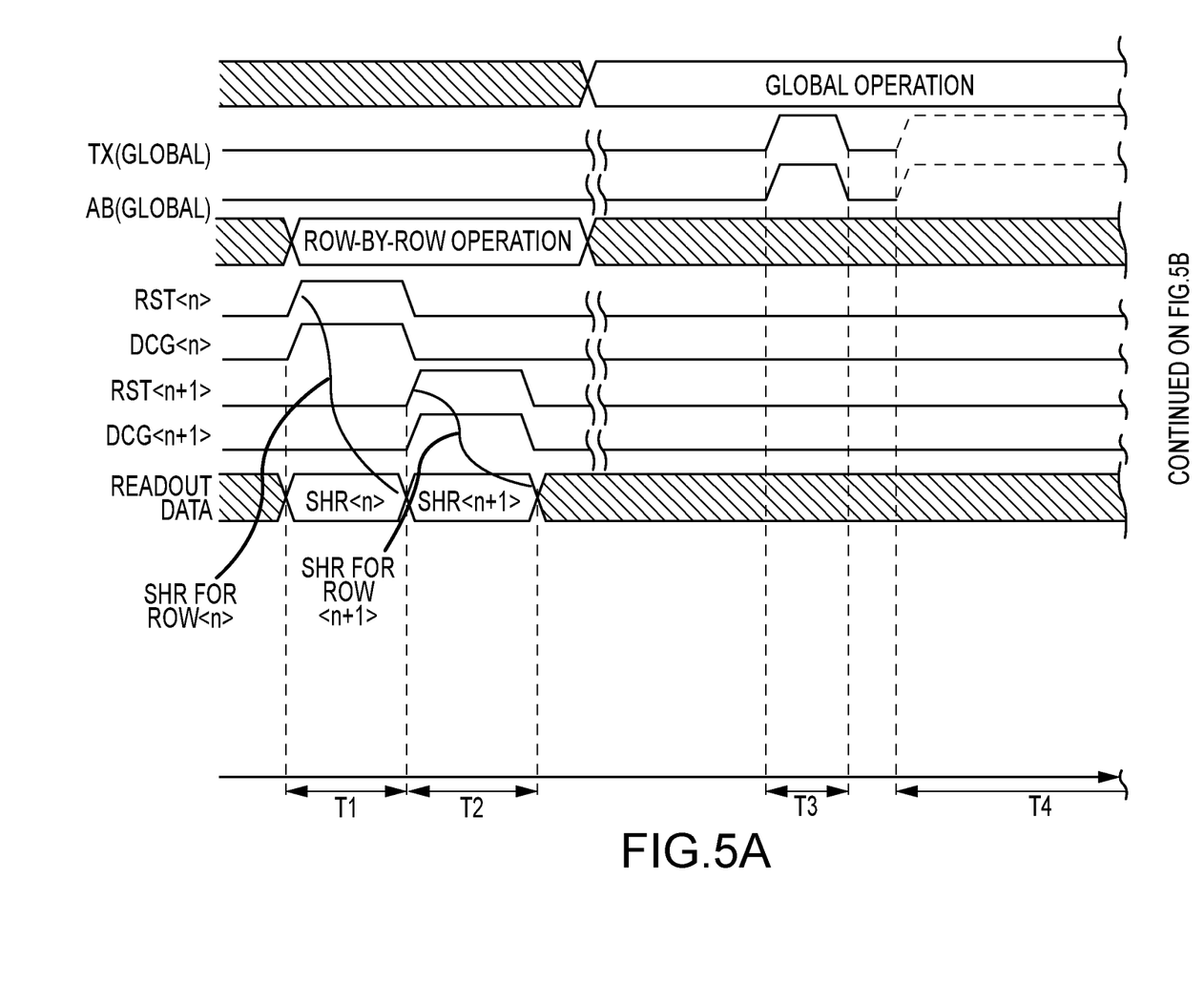
FIGS. 5A and 5B are an illustrative timing diagram for operating image pixels of the type shown in FIG. 4 in a global shutter mode in accordance with some embodiments.
Figure 5B:
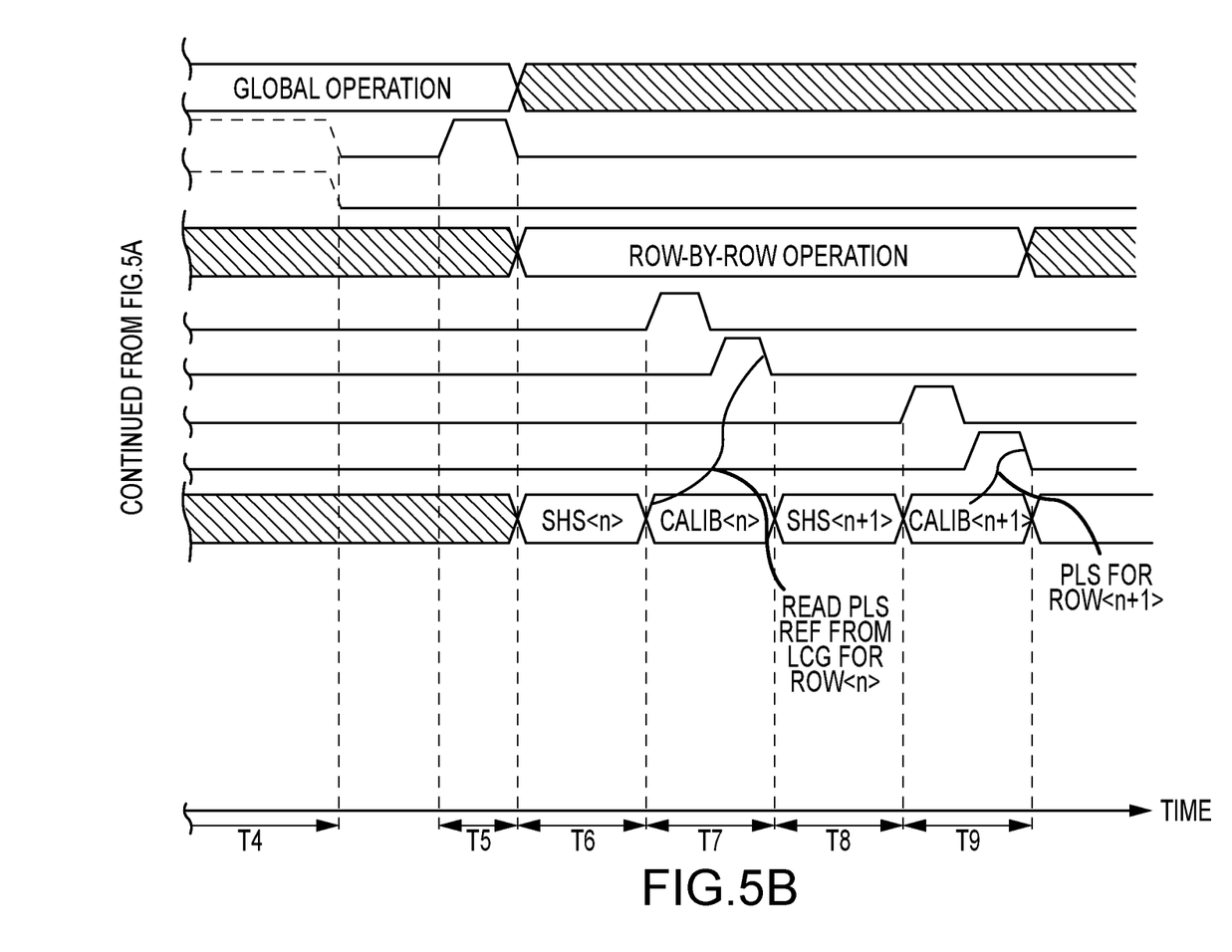

FIGS. 5A and 5B show an illustrative timing diagram for operating an image sensor having an array of image pixels of the type described in FIG. 4 (e.g., image pixel 30') in a parasitic noise collection mode. In particular, during period T1, transistors 26 and 60 (respectively receiving control signals RST<n> and DCG<n>) in pixels 30' of row n may be asserted to reset floating diffusion region 28 and storage structure 62 in these pixels to a reset level voltage. The reset level voltage may also be readout during period T1 using respective charge readout circuitry in these pixels (pixels of row n) to generate reset level signals SHR<n>. During period T2 similar floating diffusion region/charge storage region reset and reset voltage readout operations may occur for another row of pixels (pixels in row n+1). The charge storage region reset and rest voltage readout operations may occur in a rolling row-by-row manner across all of the rows in the pixel array (e.g., in a row-by-row operation).

Thereafter, overlapping with, or previous-to a portion of the earlier row-by-row operation, global operation may begin. As an example, global operation may include shuttering or turning on and off transistors 32 and 38 using global control signals AB and TX in pixels of different rows (e.g., in all pixels) during period T3. If desired, transistor 32 may be shuttered without transistor 38.

After period T3, an integration period may occur (e.g., during period T4, a period that spans from an end of period T3 to an end of period T5). During the integration period, respective photodiodes 20 in each active pixel may accumulate charge in response to incident light. At period T5, a global signal TX may be asserted to transfer the accumulated charge at photodiodes 20 to corresponding floating diffusion regions 28. Row-by-row (readout) operations may subsequently occur. If desired, global operations may overlap some of the row-by row-operations to extend the length of the integration period.

At time period T6, charge readout circuitry (e.g., source follower transistors 40 and row select transistors 42) in pixels of row n may be activated to generate image level signals SHS<n>. Subsequently, during period T7, control signal RST<n> may be asserted for pixels in row n to activate corresponding transistors 26 to reset floating diffusion region 28, removing the previously acquired photodiode signal and any parasitic light acquired noise. After a suitable period of time, control signal DCG<n> may be asserted for pixels in row n to activate corresponding transistors 60 to transfer a parasitic light noise level voltage to floating diffusion region 28. The parasitic light noise level voltage may also be read out using charge readout circuitry to generate parasitic light noise level signal Calib<n>. Similar operations as in periods T6 and T7 may occur in T8 and T9 for pixels in another row (e.g., row <n+1>). The image signal and parasitic light noise level signal readout operations may occur in a rolling row-by-row manner across all of the rows in the pixel array (e.g., in a row-by-row operation).

Digital processing circuitry may perform linear combinations of (e.g., scale and subtract operations on) corresponding image level signals and the noise level signals to generate image level signals with reduced noise.

While, in FIG. 4, transistor 60 and transistor 26 are shown to be in parallel, this is merely illustrative. If desired, transistor 60 may be coupled in series with transistor 26 along a shared path between voltage terminal 22 and floating diffusion region 28, and other additional circuitry (e.g., transistors, capacitors, switches, etc.) may be coupled to the shared path. Additionally, while some of the embodiments described herein relate to a five-transistor pixel configuration, this is merely illustrative. If desired, a charge storage structure that is operable to store a reference noise voltage level such as structure 62 in FIG. 4 may be implemented in any suitable pixel such as a pixel operable in a global shutter mode that has more than five transistors, less than five transistors, or having additional structures (e.g., diodes, transistors, storage structures, etc.) added to the pixel configuration of FIG. 4. The features described herein may analogously describe the above-mentioned pixel configurations.

In some embodiments, charge storage structure 62 may be coupled directly to pixel (column) readout circuitry and bypass charge readout circuitry in pixel 30' in FIG. 4. If desired, charge storage structure 62 may have and be coupled to a separate set of readout circuitry (e.g., that are different from transistors 40 and 42, that do not require a connection to floating diffusion region 28, etc.).

In some embodiments, the parasitic light noise level signal may be adjusted by a gain factor and/or an offset before being subtracted from the image level signal. In some embodiments, (digital) processing circuitry may only subtract the parasitic light noise level signal if the image level signal is greater than the parasitic light noise level signal. In some embodiments, (digital) processing circuitry may only subtract the parasitic light noise level signal from the image level signal if the parasitic light noise level signal is above a (pre-determined) given threshold (e.g., to avoid the addition of noise via the subtraction operation). In some embodiments, (digital) processing circuitry may only subtract the parasitic light noise level signal from the image level signal if the image level signal is less than some saturated amount (e.g., to avoid the desaturation of bright objects). These subtraction criteria may be applied to any suitable parasitic noise reference storage circuits.

In some embodiments, an image sensor having pixels 30' may utilize the difference between the parasitic light noise level signal and the image level signal (generated at the photodiode) as a means to monitor and detect moving objects. As such, control circuitry may be operable to perform object detection operations based on a comparison between the parasitic light noise level signal and the image level signal.

In some embodiments, the low conversion gain storage node (e.g., capacitor) may be used as a global shutter efficiency monitor. As such, the low conversion gain storage node may also be operable during a high conversion gain mode of operation (e.g., when the high conversion gain storage node stores photodiode generated charge for the high conversion gain storage node). The signal stored at the low conversion gain storage node can be used to subtract out parasitic noise signal inside the signal stored at the high conversion gain storage node. As an example, the subtract operation may be performed in part by a digital scaler. This may be especially helpful in the case that the image is a "low-light" image and the parasitic signal is high (e.g., bright).

Figure 6:
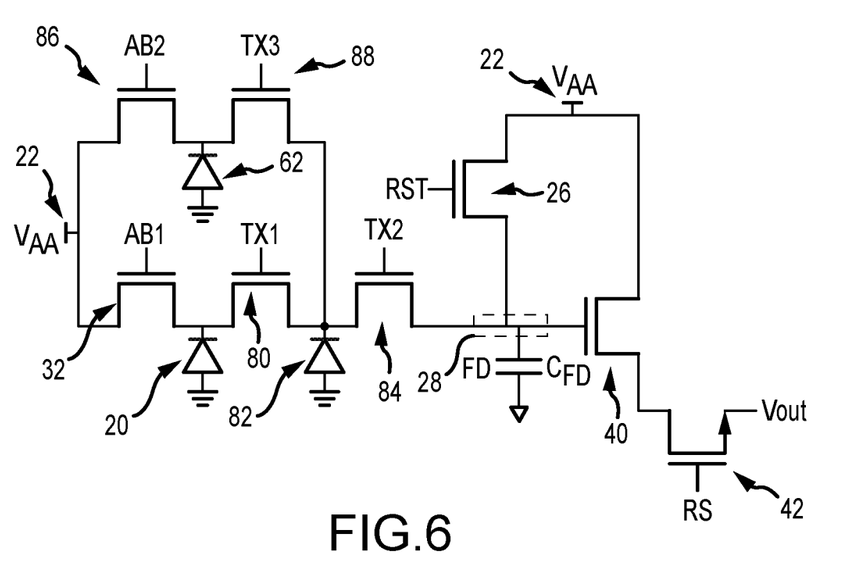
FIG. 6 is a diagram of an illustrative image pixel having a charge storage region that stores a noise reference voltage and that is coupled to an additional storage region in accordance with some embodiments.

As described in connection with the pixel configuration of FIG. 4, charge storage region 62 in FIG. 4 may be formed from storage diodes and/or other structures and may be implemented in a different configuration with respect to the rest of the pixel circuitry. As an example, FIG. 6 shows a pixel (e.g., similarly referred to as pixel 30' herein) that includes storage diode 62 (sometimes referred to herein as a reference diode) coupled to floating diffusion region 28 through storage diode 82 (sometimes referred to herein a charge storage region or charge storage structure). Storage diode 62 may be a pinned diode (e.g., having an associated pinning voltage). If desired storage diode 82 may be implemented as a storage gate or other storage structure.

As shown in FIG. 6, pixel 30' in FIG. 6 may have some components that are similar to those in pixel 30' in FIG. 4 and the description of these components are omitted to prevent unnecessarily obscuring the present embodiments. Elements in FIG. 6 with references similar to those in elements in FIG. 4 can be assumed to serve similar functions, to operate in a similar manner, etc., unless otherwise described herein.

In this configuration for pixel 30', storage diode 82 may be interposed between photodiode 20 and floating diffusion region 28. Two transistors 80 and 82 may couple photodiode 20 to storage diode 82 and may couple storage diode 82 to floating diffusion region 28, respectively. Storage diode 62 may be interposed between transistors 86 and 88. Transistor 86 may couple power supply terminal 22 to storage diode 62, thereby providing a reset path for storage diode 62. Transistor 88 may couple storage diode 62 to storage diode 82.

Storage diode 62 may similarly generate and store a parasitic light signal and transfer the parasitic light signal to floating diffusion region 28 though transistor 88, storage diode 82, and transistor 84. Once at floating diffusion region 28, the parasitic light signal may be read out using transistors 40 and 42 (or other separate readout transistors). Photodiode 20 may generate image signals and transfer the image signal to floating diffusion region 28 through transistor 80, storage diode 82, and transistor 84. Once at floating diffusion region 28, the image signal may be read out using transistors 40 and 42.

While storage diode 62 is described to serve as a parasitic light noise storage, this is merely illustrative. If desired, storage diode 62 may be implemented to serve other functions. As an example, in one mode of operation, storage diode 62 may be used to store parasitic light noise, and in another mode of operation, storage diode 62 may be used to generate and store image signals that form image frames.

Figure 7:
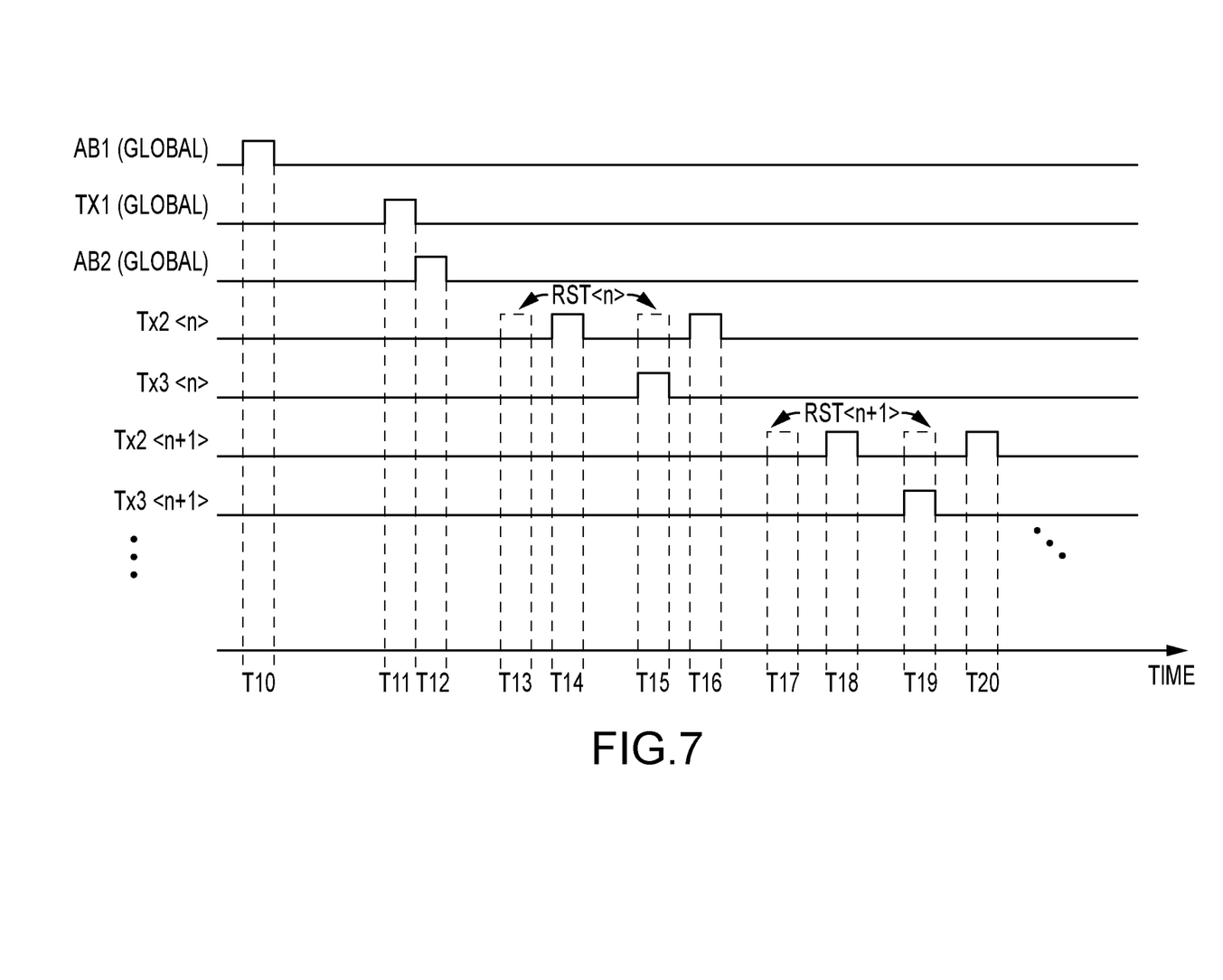
FIG. 7 is an illustrative timing diagram for operating image pixels of the type shown in FIG. 6 in a global shutter mode in accordance with some embodiments.

FIG. 7 shows an illustrative timing diagram for operating an image sensor having an array of image pixels of the type described in FIG. 6 (e.g., image pixel 30') in a parasitic noise collection mode. Similar to what is shown in FIGS. 5A and 5B, control circuitry (e.g., row control circuitry 25 in FIG. 2) may assert control signals AB1 globally (e.g., controlling transistors 32 across all active pixels 30' or across all pixels 30') to reset photodiodes 20 at time period T10. When control signal AB1 is deasserted, a charge integration time may begin. The charge integration time may end at the end of time period T11. During time period T11, control circuitry may assert control signal TX1 globally (controlling transistors 80) to transfer integrated charge from photodiodes 20 to storage diode 82. During time period T12, control circuitry may assert control signal AB2 globally (controlling transistors 86) to reset storage diode 62. When control signals AB2 is deasserted, storage diode 62 may begin accumulating charge based on parasitic light noise.

After a suitable amount of time, control circuitry may assert control signals to begin readout operations in a rolling manner across rows of pixels 30'. At time period T14, control signal TX2 controlling transistors 84 for a given row of pixels (row n) may be asserted to transfer the image signals stored at storage diode 82 (transferred during time period T11) to floating diffusion region 28. This image signal may be read out using readout circuitry (e.g., control circuitry may assert control signal RS). If desired, the image signal may be read out using a correlated double sampling (CDS) scheme. In this scenario, prior to time period T14 (e.g., during time period t13), control circuitry may assert control signal RST controlling transistors 26 for row n to reset floating diffusion region 28. The reset level signal and the image signal may be read out in a CDS scheme.

At time period T15, control circuitry may assert control signal TX3 controlling transistors 88 for row n to transfer parasitic light noise signals to storage diode 82. Subsequently and/or simultaneously, during time period T16, control circuitry may assert control signal TX2 for row n to transfer parasitic light signals to floating diffusion region 28 for readout. Similar to the image signals, the parasitic light signals may be read out in a CDS scheme. In this scenario, control circuitry may assert control signal RST for row n prior to time period T16 (e.g., during time period T16). While the timing of FIG. 17 illustrates that the assertion for control signal RST is synchronous with the assertion for control signal TX3, this is merely illustrative. If desired, these assertions may be only partially overlapping or non-overlapping in time.

During time periods T17 to T20, operation analogous to the operation during time periods T13-T14 for row n may occur for another row (e.g., row <n+1>). Following time period T20, similar operations may occur for yet another row. This rolling readout scheme may occur until all image signals and parasitic light noise level signals are readout from all rows.

Figure 8:
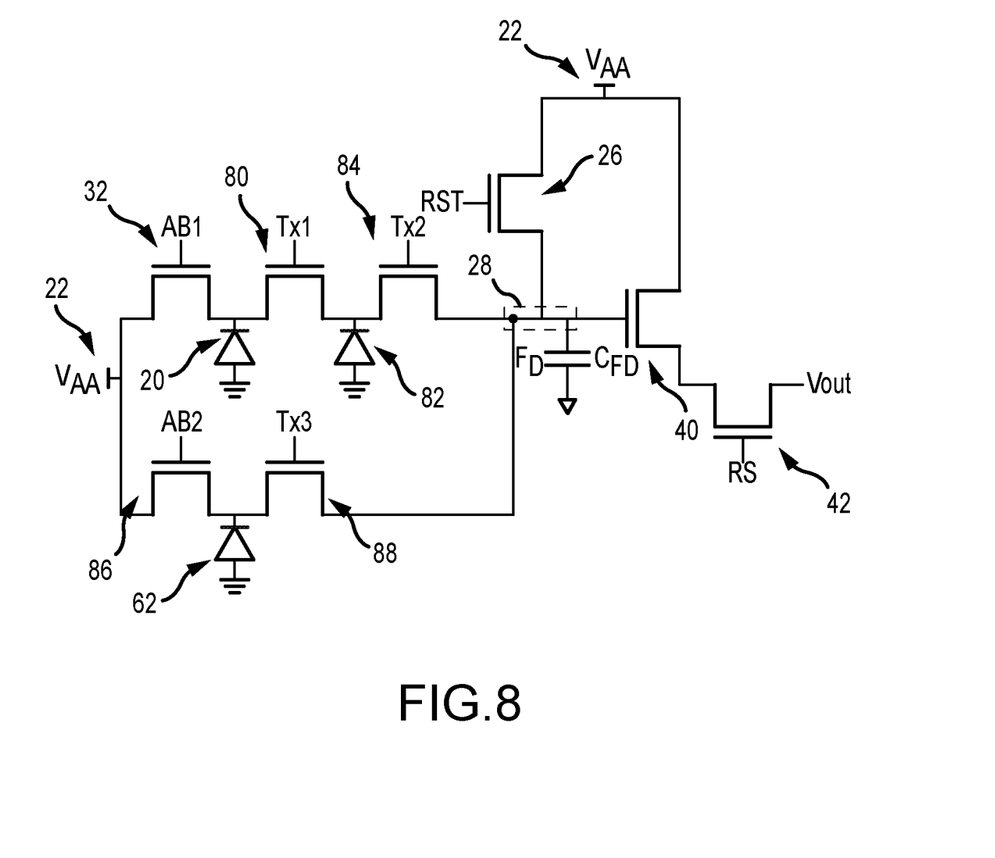
FIG. 8 is a diagram of an illustrative image pixel having a charge storage region that stores a noise reference voltage and that is coupled to a floating diffusion region in accordance with some embodiments.

As another example, FIG. 8 shows a pixel (e.g., similarly referred to as pixel 30' herein) that includes storage diode 62 coupled to floating diffusion region 28. Pixel 30' in FIG. 8 may have some components that are similar to those in pixel 30' in FIG. 6 and the description of these components are omitted to prevent unnecessarily obscuring the present embodiments. Elements in FIG. 8 with references similar to those in elements in FIG. 6 can be assumed to serve similar functions, to operate in a similar manner, etc., unless otherwise described herein.

As shown in FIG. 8, instead of transistor 88 coupling storage diode 62 to storage diode 82 (as in FIG. 6), transistor 88 in FIG. 8 may couple storage diode 62 directly to floating diffusion region 28. Additionally, because of this configuration, storage diode 62 may be an unpinned diode (or be a pinned diode similar to diode 62 in FIG. 6).

Figure 9:
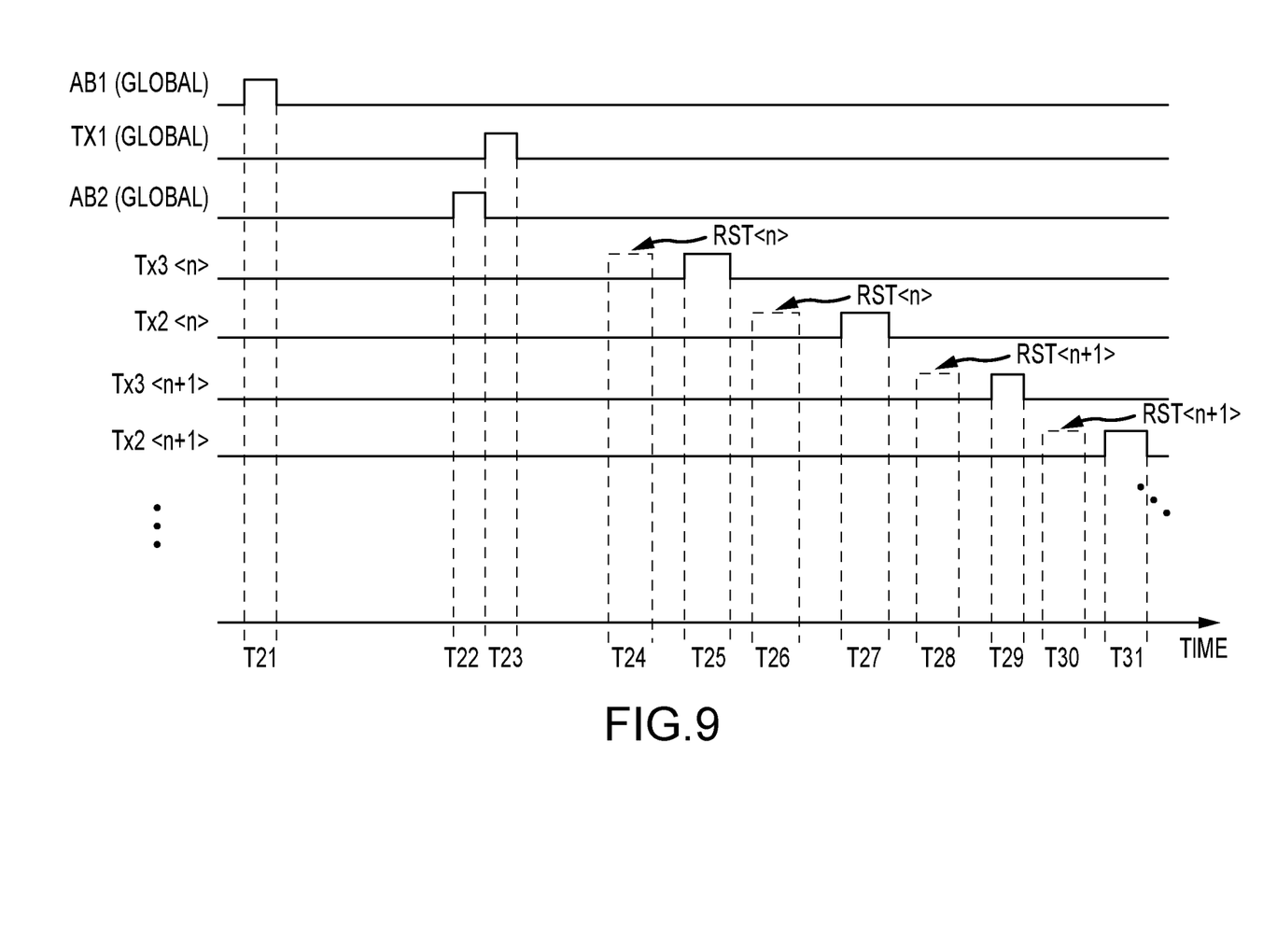
FIG. 9 is an illustrative timing diagram for operating image pixels of the type shown in FIG. 8 in a global shutter mode in accordance with some embodiments.

FIG. 9 shows an illustrative timing diagram for operating an image sensor having an array of image pixels of the type described in FIG. 8 (e.g., image pixel 30') in a parasitic noise collection mode. Control circuitry may assert signals AB1, AB2, and TX1 globally during time periods, T21, T22, and T23. Different from FIG. 7, the assertion of control signal AB2 is prior to the assertion of control signal TX1. However, this is merely illustrative. If desired, the assertion of control signal AB2 may also follow or overlap with the assertion of control signal TX1.

Following time period T23, control circuitry may control pixels 30 to perform readout operation in a row-by-row rolling manner. At time period T25, control circuitry may assert control signal TX3 for a given row of pixels 30 (e.g., for row n) to transfer parasitic light signals to floating diffusion region 28 for readout. In the case of a CDS readout scheme, control signal RST for row n may be asserted during time period T24.

At time period T27, control circuitry may assert control signal TX2 for row n to transfer image light signals to floating diffusion region 28 for readout. In the case of a CDS readout scheme, control signal RST for row n may be asserted during time period T26.

During time periods T28 to T31, operation analogous to the operation during time periods T24-T27 for row n may occur for another row (e.g., row <n+1>). Following time period T31, similar operations may occur for yet another row. This rolling readout scheme may occur until all image signals and parasitic light noise level signals are readout from all rows.

Various embodiments have been described illustrating systems and methods for generating image signals with reduced noise.

In particular, an image sensor may include an array of image pixels arranged in columns and rows. Each pixel in the array may include a photosensitive element coupled to a floating diffusion region via a first path and operable to generate an image level signal using global shutter operations and a charge storage structure coupled to the floating diffusion region via a second path different from the first path and operable to generate a parasitic light noise level signal using global shutter operations. The image sensor may also include an additional charge storage structure.

Control circuitry may be operable to perform readout operations on the image level signal operation on the parasitic light noise level signal in a row-by-row manner (to perform readout operations for image level signals and parasitic light noise level signals for a given row prior to performing readout operations for image level signals and parasitic light noise level signals for a subsequent row). In other words, the readout operations may be in a row-by-row manner on sets of the image signals and the parasitic light signals, each set corresponding to the image signals and the parasitic light signals for a row in the rows.

Processing circuitry may be operable to selectively perform a subtraction operation based on the image level signal and the parasitic light noise level signal (e.g., to perform a linear combination operation such as subtracting a scaled version of the parasitic light noise level signal from the image level signal to generate a reduced noise signal for forming an image frame). As examples, the subtraction operation may be performed based on whether the parasitic light noise level signal is greater than a threshold level, whether the image level signal is less than a threshold level, etc.

As an example, the charge storage structure may be a storage diode coupled to the floating diffusion region via a first transistor, the floating diffusion region may be coupled to a power supply terminal via a second transistor, and the storage diode may be decoupled from the power supply terminal. The floating diffusion region may be interposed between the photosensitive element and the storage diode. The storage diode may be operable to store a low conversion gain signal in a low conversion gain mode of operation.

In some embodiments, the photosensitive element may be coupled to readout circuitry via a first path, and the charge storage structure coupled to the readout circuitry via a second path different from the first path and operable to generate a parasitic light signal. The readout circuitry may include a first set of transistors coupled to the photosensitive element and operable to read out the image signal, and a second set of transistors, different from the first set, coupled to the charge storage structure and operable to read out the parasitic light signal. If desired, the second set of transistors may be coupled to and shared between corresponding charge storage regions in two or more image pixels.

The control circuitry may be operable to assert a first global control signal for the image pixels to begin generating the image signal and to control the image pixels to begin generating the parasitic light signal. The control circuitry may be operable to assert a second global control signal controlling a transistor to transfer the image signal to a charge storage region. The control circuitry may be operable to transfer the parasitic light signal to the charge storage region in a row-by-row manner. As examples, the control circuitry may be operable to assert a set of control signals in a row-by-row manner or a third global control signal to control the image pixels to begin generating the parasitic light signal.

In some embodiments with an image pixel having an additional charge storage structure interposed between the photosensitive element and the floating diffusion region, the image pixel may include a first transistor that couples the photosensitive element to the additional charge storage region, a second transistor that couples the charge storage region to the additional charge storage region, and a third transistor that couples the additional charge storage region to the floating diffusion region.

The foregoing is merely illustrative of the principles of this invention and various modifications can be made by those skilled in the art without departing from the scope and spirit of the invention.

What is claimed is:

1. An image sensor, comprising:
   an array of image pixels, wherein an image pixel in the array includes:
      a photosensitive element coupled to a floating diffusion region via a first path and operable to generate an image level signal, and
      a charge storage structure coupled to the floating diffusion region via a second path and operable to generate a parasitic light noise level signal;
   control circuitry operable to perform a readout operation on the image level signal and a readout operation on the parasitic light noise level signal; and
   processing circuitry operable to perform a subtraction operation based on the image level signal and the parasitic light noise level signal, wherein the processing circuitry is operable to perform the subtraction operation based on whether the parasitic light noise level signal is greater than a parasitic light noise signal threshold level or based on whether the image level signal is less than an image signal threshold level.

2. The image sensor defined in claim 1, wherein the processing circuitry is operable to subtract a modified version of the parasitic light noise level signal from the image level signal to generate a reduced noise signal for forming an image frame.

3. The image sensor defined in claim 1, wherein the charge storage structure comprises a storage diode coupled to the floating diffusion region via a first transistor, the floating diffusion region is coupled to a power supply terminal via a second transistor, and the storage diode is electrically disconnected from the power supply terminal by a capacitor.

4. The image sensor defined in claim 3, wherein the storage diode is operable to store a low conversion gain signal in a low conversion gain mode of operation.

5. The image sensor defined in claim 3, wherein the image pixel includes an additional charge storage structure interposed between the photosensitive element and the floating diffusion region.

6. The image sensor defined in claim 3, wherein the floating diffusion region is interposed between the photosensitive element and the storage diode.

7. The image sensor defined in claim 1, wherein the array of image pixels is arranged in rows and columns, the control circuitry is operable to perform readout operations for image level signals and parasitic light noise level signals for a given row prior to performing readout operations for image level signals and parasitic light noise level signals for a subsequent row.

8. The image sensor defined in claim 1, wherein the processing circuitry is operable to perform motion detection based on a comparison between the image level signal and the parasitic light noise level signal.

9. An image sensor, comprising:
   image pixels arranged in rows and columns, wherein each image pixel in the image pixels includes:
      a photosensitive element coupled to a floating diffusion region via a first path and configured to generate an image signal, and
      a charge storage structure coupled to the floating diffusion region via a second path and configured to generate a parasitic light signal that is representative of an amount of parasitic light noise at the floating diffusion region, wherein the first path is separate from the second path; and
   control circuitry configured to assert a first global control signal for the image pixels to begin generating the image signals, to control the image pixels to begin generating the parasitic light signals, and to perform readout operations in a row-by-row manner on sets of the image signals and the parasitic light signals, each set corresponding to the image signals and the parasitic light signals for a row of image pixels in the rows of image pixels.

10. The image sensor defined in claim 9, wherein each image pixel comprises a transistor coupling the photosensitive element to a charge storage region and the control circuitry is configured to assert a second global control signal controlling the transistor to transfer the image signal to the charge storage region.

11. The image sensor defined in claim 10, wherein the control circuitry is configured to transfer the parasitic light signal to the floating diffusion region in a row-by-row manner.

12. The image sensor defined in claim 9, wherein the control circuitry is configured to assert a set of control signals in a row-by-row manner to control the image pixels to begin generating the parasitic light signals.

13. The image sensor defined in claim 9, wherein the control circuitry is configured to assert a second global control signal to control the image signals to begin generating the parasitic light signals.

14. The image sensor defined in claim 9, wherein a first set of transistors is coupled to the photosensitive element and operable to read out the image signal, a second set of transistors is coupled to the charge storage structure and operable to read out the parasitic light signal, and the first set of transistors is different from the second set of transistors.

15. The image sensor defined in claim 14, wherein the second set of transistors is coupled to and shared between two or more corresponding image pixels.

16. An image sensor, comprising:
an array of image pixels, wherein an image pixel in the array includes:
a photosensitive element coupled to a floating diffusion region via a first path and operable to generate an image level signal, and
a charge storage structure coupled to the floating diffusion region via a first transistor in a second path, operable to generate a parasitic light noise level signal in a parasitic light collection mode of operation, and operable to store a low conversion gain signal in a low conversion gain mode of operation, wherein the first path is separate from the second path, and the floating diffusion region is coupled to a power supply terminal via a second transistor; and
readout circuitry operable to perform readout operations on the image level signal and the parasitic light noise level signal.

17. The image sensor defined in claim 16, further comprising:
processing circuitry operable to perform a linear combination operation based on the image level signal and the parasitic light noise level signal.

18. The image sensor defined in claim 16, wherein the charge storage structure comprises a storage diode electrically disconnected from the power supply terminal.

* * * * *